United States Patent
Cheng et al.

(10) Patent No.: US 9,659,824 B2
(45) Date of Patent: May 23, 2017

(54) GRAPHOEPITAXY DIRECTED SELF-ASSEMBLY PROCESS FOR SEMICONDUCTOR FIN FORMATION

(71) Applicant: INTERNATIONAL BUSINESS MACHINES CORPORATION, Armonk, NY (US)

(72) Inventors: Joy Cheng, San Jose, CA (US); Matthew E. Colburn, Schenectady, NY (US); Michael A. Guillorn, Yorktown Heights, NY (US); Chi-Chun Liu, Altamont, NY (US); Melia Tjio, San Jose, CA (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/697,693

(22) Filed: Apr. 28, 2015

(65) Prior Publication Data

US 2016/0322259 A1 Nov. 3, 2016

(51) Int. Cl.
  *G01R 31/26* (2014.01)
  *H01L 21/8234* (2006.01)
  (Continued)

(52) U.S. Cl.
  CPC .. *H01L 21/823431* (2013.01); *H01L 21/0273* (2013.01); *H01L 21/3081* (2013.01); *H01L 21/3086* (2013.01); *H01L 21/845* (2013.01)

(58) Field of Classification Search
  CPC .................................................. H01L 21/3083
  See application file for complete search history.

(56) References Cited

U.S. PATENT DOCUMENTS 4,125,650 A 11/1978 Chiu et al.
6,541,361 B2 4/2003 Ko et al.
(Continued)

FOREIGN PATENT DOCUMENTS

DE 198 57 094 A1 9/1999
JP 5-241353 A 9/1993
(Continued)

OTHER PUBLICATIONS

Tsai, H. et al., "Pattern transfer of directed self-assembly (DSA) patterns for CMOS device applications", Proc. of SPIE, vol. 8685, Mar. 2013, 86850L, pp. 1-9.

(Continued)

*Primary Examiner* — Jaehwan Oh
*Assistant Examiner* — Andre' C Stevenson
(74) *Attorney, Agent, or Firm* — Scully, Scott, Murphy & Presser, P.C.; Louis J. Percello, Esq.

(57) ABSTRACT

Guiding pattern portions are formed on a surface of a lithographic material stack that is disposed on a surface of a semiconductor substrate. A copolymer layer is then formed between each neighboring pair of guiding pattern portions and thereafter a directed self-assembly process is performed that causes phase separation of the various polymeric domains of the copolymer layer. Each guiding pattern portion is selectively removed, followed by the removal of each first phase separated polymeric domain. Each second phase separated polymeric domain remains and is used as an etch mask in forming semiconductor fins in an upper semiconductor material portion of the semiconductor substrate.

20 Claims, 4 Drawing Sheets

(51) Int. Cl.
*H01L 21/84* (2006.01)
*H01L 21/308* (2006.01)
*H01L 21/027* (2006.01)

(56) References Cited

U.S. PATENT DOCUMENTS

| | | | |
|---|---|---|---|
| 7,605,081 B2 | 10/2009 | Yang et al. | |
| 7,709,079 B2 | 5/2010 | Black et al. | |
| 7,855,105 B1 | 12/2010 | Jagannathan et al. | |
| 7,977,247 B2 | 7/2011 | Black et al. | |
| 8,084,186 B2 * | 12/2011 | Abdallah | G03F 7/40 430/270.1 |
| 8,137,893 B2 | 3/2012 | Burns et al. | |
| 8,207,028 B2 | 6/2012 | Dalton et al. | |
| 8,450,418 B2 | 5/2013 | Millward et al. | |
| 8,513,131 B2 * | 8/2013 | Cai | H01L 21/3086 246/12 |
| 8,536,031 B2 * | 9/2013 | Arnold | H01L 21/0274 257/E21.006 |
| 8,603,381 B2 * | 12/2013 | Berggren | B82Y 10/00 264/239 |
| 8,735,046 B2 | 5/2014 | Hatakeyama et al. | |
| 9,209,038 B2 * | 12/2015 | Cantone | H01L 21/3086 |
| 2003/0129816 A1 | 7/2003 | Ko et al. | |
| 2008/0318139 A1 * | 12/2008 | Dersch | B82Y 10/00 430/5 |
| 2011/0147985 A1 | 6/2011 | Cheng et al. | |
| 2013/0000846 A1 * | 1/2013 | Romano | G03F 7/0035 156/345.24 |
| 2014/0021166 A1 | 1/2014 | Seino et al. | |
| 2014/0072915 A1 | 3/2014 | Chen et al. | |
| 2014/0099771 A1 * | 4/2014 | Chang | H01L 21/02639 438/429 |
| 2014/0147794 A1 | 5/2014 | Sugie et al. | |
| 2014/0148012 A1 | 5/2014 | Guillorn et al. | |
| 2014/0227476 A1 * | 8/2014 | Menon | B29C 33/3878 428/92 |
| 2015/0132962 A1 * | 5/2015 | Hu | H01L 21/0337 438/703 |

FOREIGN PATENT DOCUMENTS

| | | |
|---|---|---|
| JP | 6-337524 A1 | 12/1994 |
| WO | 2014/069245 A1 | 5/2014 |

OTHER PUBLICATIONS

Liu, C. et al., "Toward electrical testable SOI devices using DSA for fin formation", Proc. of SPIE, vol. 9049, 2014, pp. 1-12.

Tsai, H. et al., "Two-Dimensional Pattern Formation Using Graphoepitaxy of PS-b-PMMA Block Copolymers for Advanced FinFET Device and Circuit Fabrication", ACS Nano, vol. 8, No. 5, 2014, pp. 5227-5232.

Liu, C. et al., "Directed Self-Assembly Process Implementation in a 300mm Pilot Line Environment", Proc. of SPIE, vol. 8680, 2013, pp. 1-8.

Cheng, J. et al., "Simple and Versatile Methods to Integrate Directed Self-Assembly with Optical Lithography Using a Polarity-Switched Photoresist", ACSNANO, vol. 4, No. 8, 2010, pp. 4815-4823.

List of IBM Patents or Patent Applications Treated as Related, dated Apr. 28, 2015, 2 pages.

* cited by examiner

US 9,659,824 B2

GRAPHOEPITAXY DIRECTED SELF-ASSEMBLY PROCESS FOR SEMICONDUCTOR FIN FORMATION

This invention was made with Government support under Contract No. FA8650-10-C-70381 awarded by Defense Advanced Research Projects Agency (DARPA). The Government has certain rights in this invention.

BACKGROUND

The present application relates to semiconductor processing, and more particularly to a method for forming semiconductor fins with self-aligned customization utilizing a graphoepitaxy directed self-assembly process.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In finFET devices, a functional gate structure straddles a semiconductor fin.

Advanced technology node requires both high density semiconductor fins and precise customization capability. High density, e.g., sub 30 nm pitch, line/space arrays can be achieved by utilizing multiple sidewall image transfer (SIT) processes or directed self-assembly (DSA). However, based on the state of the art lithography tools and materials, removing one single line from the array without damaging the adjacent fin structure is extremely difficult due to the limitation from critical dimension uniformity, overlay and line-edge roughness.

In view of the above, there is a continued need for providing customized, high density semiconductor fins that overcomes the problems associated with prior art multiple sidewall image transfer processes and directed self-assembly processes.

SUMMARY

Guiding pattern masks are formed on a surface of a lithographic material stack that is disposed on a surface of a semiconductor substrate. A block copolymer (BCP) layer is then formed between neighboring pairs of guiding pattern masks and thereafter a directed self-assembly process is performed that causes phase separation of the various polymeric domains of the copolymer layer. Each guiding pattern mask is selectively removed without damaging the BCP layer, followed by the removal of each first phase separated polymeric domain. Each second phase separated polymeric domain remains and is used as an etch mask in forming semiconductor fins in an upper semiconductor material portion of the semiconductor substrate.

In one aspect of the present application, a method of forming semiconductor fins is provided. In one embodiment of the present application, the method includes forming a plurality of guiding pattern masks on a surface of a lithographic material stack, the lithographic material stack is located on a surface of a semiconductor substrate. Next, a self-assembled block copolymer structure is formed between each neighboring pair of guiding pattern masks and on a surface of the lithographic material stack. The self-assembled block copolymer structure comprises an array of first phase separated polymeric domains and an array of second phase separated polymeric domains. Each guiding pattern mask is then selectively removed without damaging the self-assembled block copolymer structure and thereafter each first phase separated polymeric domain of the array of first phase separated polymeric domains is removed selective to the array of second phase separated polymeric domains. An array of semiconductor fins is then formed in an upper semiconductor material portion of the semiconductor substrate utilizing the array of second phase separated polymeric domains as an etch mask.

DETAILED DESCRIPTION

Figure 1:
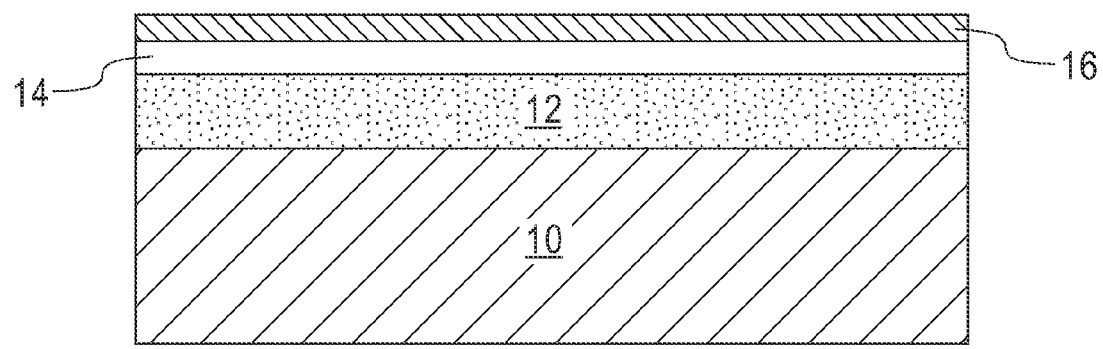
FIG. 1 is a cross sectional view of an exemplary semiconductor structure including a lithographic material stack comprising, from bottom to top, an optical planarization layer, an antireflective coating, and an orientation control layer, that is disposed on a surface of a semiconductor substrate and that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including a lithographic material stack (12, 14 and 16) that is disposed on a surface of a semiconductor substrate 10 and that can be employed in accordance with an embodiment of the present application. The lithographic material stack comprises, from bottom to top, an optical planarization layer 12, an antireflective coating 14, and an orientation control layer 16. One or more hard masks (not shown) can be included within the lithographic material stack, typically between the optical planarization layer 12 and the semiconductor substrate 10, for etching purposes.

In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 10 can be comprised of a single crystalline semiconductor material, such as, for example, single crystalline silicon. In other embodiments, the bulk semiconductor substrate that can provide the semiconductor substrate 10 may comprise a polycrystalline or amorphous semiconductor material.

In embodiments of the present application in which a bulk semiconductor substrate is employed as semiconductor substrate 10, semiconductor fins can be subsequently formed into a top portion of the bulk semiconductor substrate utilizing the method of the present application.

In another embodiment, the semiconductor substrate 10 may comprise a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer. In such an embodiment, the semiconductor fins can be subsequently processed into the topmost semiconductor layer of the SOI substrate utilizing the method of the present application. In this embodiment, the semiconductor fins (to be subsequently formed) are located on a topmost surface of the insulator layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

The optical planarization layer 12 of the lithographic material stack that can be employed in the present application comprises a self-planarizing material. As used herein, a self-planarizing material is a material that flows at a standard ambient temperature and pressure (SATP), i.e., 20° C. (293.15 K, 68° F.) and an absolute pressure of 101.325 kPa (14.696 psi, 1 atm), to provide a planar top surface. In one example, the optical planarization layer 12 can be an organic material including C, O, and H, and optionally including Si and/or F. In another example, the optical planarization layer 12 can be amorphous carbon. In a further example, the optical planarization layer 12 can be a spin-on carbon material. In an even further example, diamond-like carbon can be used as the material of the optical planarization layer 12. The optical planarization layer 12 can be formed by spin-on coating, chemical vapor deposition, plasma enhanced chemical vapor deposition, evaporation or chemical solution deposition. The thickness of the optical planarization layer 12 can be from 10 nm to 300 nm, although lesser and greater thicknesses can also be employed.

The antireflective coating 14 of the lithographic material stack comprises any material that can reduce image distortions associated with reflections off the surface of semiconductor substrate 10. In one example, the antireflective coating 14 of the lithographic material stack comprises a silicon (Si)-containing antireflective coating material. The antireflective coating 14 can be formed by spin-on coating, chemical vapor deposition, plasma enhanced chemical vapor deposition, atomic layer deposition (ALD), plasma-enhanced ALD, evaporation or chemical solution deposition. The thickness of the antireflective coating 14 can be from 10 nm to 150 nm, although lesser and greater thicknesses can also be employed.

The orientation control layer 16 of the lithographic material stack is a polymer layer that can adhere to an underlying surface and achieve a certain desired surface energy. The orientation control layer 16 is typically a random copolymer that contains a polar polymeric component and a non-polar polymeric component; the random copolymer that can be used in providing the orientation control layer 16 may have the same or different polymeric components as defined below for the copolymer layer that provides the self-assembled block copolymer structure. By "random" it is meant a polymeric material that lacks any defined repeating blocks. In one example, the orientation control layer 16 may comprise a random copolymer of poly (methyl methacrylate) (i.e., PMMA) as the polar polymeric component, and polystyrene (PS) as the non-polar polymeric component. By controlling the ratio of non-polar polymeric component (i.e., PS) to polar polymeric component (i.e., PMMA) in the synthesis stage, one can achieve a desired surface property. In some embodiments, and to anchor the random copolymer to the underlying surface of the antireflective coating 14, one or several functional groups can be added to the end of the polymer chain or in a random position of the polymer chain to react with the antireflective coating and create covalent bonding. Cross linkers such as, for example, azide ($N_3$), benzocyclobutane (BCB), and glycidyl methacrylate (GMA) can also be used to improve adhesion to the antireflective coating 14 because of the polymer network after cross linking. The orientation control layer 16 can be formed by spin-on coating, evaporation or chemical solution deposition. The thickness of the orientation control layer 16 can be from 2 nm to 20 nm, although lesser and greater thicknesses can also be employed.

Figure 2:
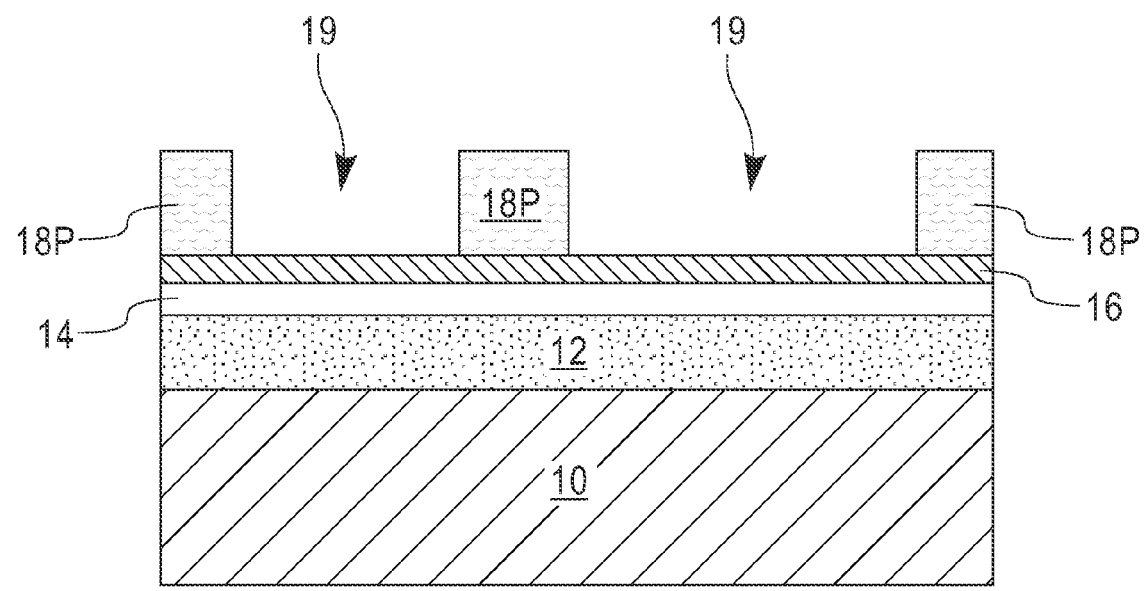
FIG. 2 is a cross sectional view of the exemplary semiconductor structure of FIG. 1 after forming a plurality of guiding pattern masks on the lithographic material stack.

Referring now to FIG. 2, there is illustrated the exemplary semiconductor structure of FIG. 1 after forming a plurality of guiding pattern masks 18P on the topmost surface of the lithographic material stack (12, 14 and 16). The guiding pattern masks 18P create openings 19 in which a subsequent formed self-assembled block copolymer structure can be formed. Each opening 19 may have a same or different width.

In one embodiment of the present application, each guiding pattern mask 18P comprises a hardened photoresist. By "hardened photoresist" it is meant a photoresist material that has been actinically or chemically altered or "de-protected" or "polarity switched" such that it is no longer soluble in its original casting solvent. The hardened photoresists can be provided by first forming a blanket layer of photoresist material (not shown) on the topmost surface of the lithographic material stack (12, 14 and 16). The photoresist material that may be employed in the present application includes a positive-tone photoresist material or a negative-tone photoresist material. The photoresist material can be formed utilizing a deposition process such as, for example, spin-on coating or chemical solution deposition. The thickness of the blanket layer of photoresist material can be from 50 nm to 250 nm, although lesser and greater thicknesses can also be employed. The blanket layer of photoresist material is then patterned by lithography. Lithography includes exposing the blanket layer of photoresist material to a desired pattern of irradiation and then developing the photoresist material utilizing a conventional resist developer.

Next, and in one embodiment in which a hardening agent is chosen to be used for resist hardening, the hardening agent is applied to each patterned photoresist portion. The hardening agent can be applied utilizing spin-coating, spray coating, dip coating, brush coating or other like coating methods. Examples of hardening agents that can be used in the present application include conventional thermal acid generators such as, for example, the polymer structures described at col. 6, lines 38-64 of U.S. Pat. No. 8,137,893 B2 to Burns et al., the entire content of which is incorporated herein by reference. Next, each patterned photoresist portion including the hardening agent is subjected to a baking process which modifies the photoresist material to be insoluble in the casting solvent of the photoresist and the block copolymer (BCP). During the baking process, acid is released from the hardening agent and a deprotection reaction occurs. In one embodiment of the present application, the baking process can be performed at a temperature from 100° C. to 160° C. Other temperatures that are lesser than, or greater than, the aforementioned temperature range can be used as long as the temperature of the baking process provides the acid releasing from the acidic polymer coating to each of the patterned photoresist portions. The baking process can be performed in air or in an inert ambient including, for example, nitrogen, helium, argon, neon, or mixtures thereof. The baking process can be performed for a time period from 30 seconds to 5 minutes. Other times can also be used for the baking process. A rinse step in solvent follows the baking step in order to remove the acidic polymer coating and leaves the modified photoresist on the surface. In some embodiments of the present application, an optional second baking process may be performed after the rinsing step. The conditions (temperature, time and ambient) mentioned for the first baking process can also be used for the second baking process. The hardened photoresists that can be used as the guiding pattern masks 18P are soluble in an aqueous developer.

In another embodiment of the present application, each guiding pattern mask of the plurality of guiding pattern masks 18P comprises an e-beam resist. By "e-beam resist" it is meant a molecular or polymeric material that can be patterned by e-beam lithography. Examples of e-beam resists that can be used in the present application include hydrogen silsesquioxane (HSQ) or methyl silsesquioxane (MSQ). The e-beam resist may include one of the cross linkers mentioned above for the orientation control layer 16. When e-beam resists are used as the guiding pattern masks 18P, the e-beam resists are formed by first providing a blanket layer of e-beam resist material. The blanket layer of e-beam resist material can be formed a deposition process such as, for example, spin-on coating or chemical solution deposition. The thickness of the blanket layer of e-beam resist material can be from 50 nm to 250 nm, although lesser and greater thicknesses can also be employed. The blanket layer of e-beam resist is then patterned by e-beam lithography.

Figure 3:
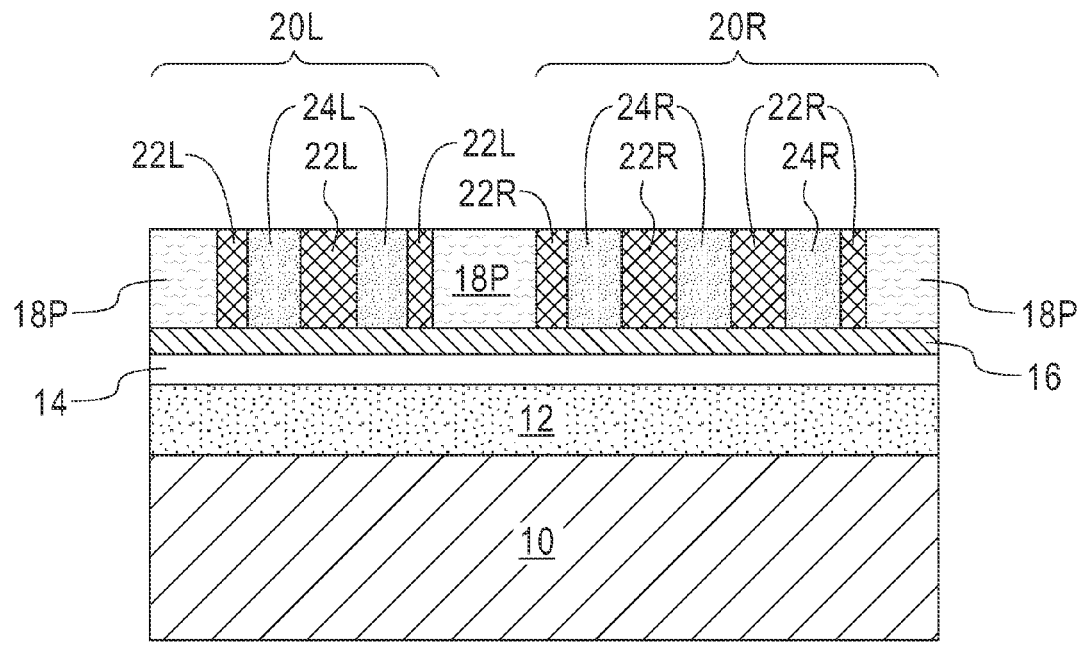
FIG. 3 is a cross sectional view of the exemplary semiconductor structure of FIG. 2 after forming a copolymer layer between each neighboring pair of guiding pattern masks and performing a directed assembly process to provide a self-assembled block copolymer structure.

Referring now to FIG. 3, there is illustrated the exemplary semiconductor structure of FIG. 2 after forming a copolymer layer between each neighboring pair of guiding pattern masks 18P and within each opening 19 and then performing a directed self-assembly process to provide a self-assembled block copolymer structure 20L, 20R. These steps convert the copolymer layer into a self-assembled block copolymer structure 20L, 20R located between each neighboring pair of guiding pattern masks 18P and within opening 19.

The self-assembled block copolymer structure 20L, 20R is located on a topmost surface of the lithographic material stack (12, 14 and 16) and comprises an array of first phase separated polymeric domains 22L, 22R and an array of second phase separated polymeric domains 24L, 24R. In some embodiments and as shown, a topmost surface of the self-assembled block copolymer structure (20L, 20R) is coplanar with a topmost surface of each guiding pattern mask 18P. In some embodiments (not shown), the topmost surface of the self-assembled block copolymer structure (20L, 20R) is located beneath a topmost surface of each guiding pattern mask 18P. In some other embodiments (not shown), and when the block copolymer (BCP) overcoats the guiding patterns, an $O_2$-based etch back process can be utilized to reveal the top surface of the guiding patterns before proceeding to the selective guiding pattern removal process.

The copolymer layer can be applied within each opening 19, for example, by spin coating or chemical solution deposition. The copolymer material that provides the copolymer layer comprises a first polymeric block component and a second polymeric block component that are immiscible with each other. In some embodiments of the present application, the material that provides the copolymer layer may be self-planarizing. The copolymer material includes self-assembling block copolymers that are capable of self-organizing into nanometer-scale patterns. By "nanoscale patterns" it is meant features that have a size of less than 40 nm.

The copolymer layer can include a first polymer material, i.e., a first polymeric block component, and a second polymer material, i.e., a second polymeric block component. The first polymeric block component and the second polymeric block component are selected such that a self-assembly of first polymer blocks including the first polymeric block component and second polymer blocks including the second polymeric block component can be subsequently formed upon phase separation of the first and second polymeric block components. The phase separated first polymeric copolymer component is referred to as the "first phase separated polymeric domain", while the phase separated second polymeric copolymer component is referred to herein as the "second phase separated polymeric domain".

Exemplary materials for the first polymeric block component and the second polymeric block component are described in U.S. Pat. No. 7,605,081 to Yang et al., the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, polystyrene-block-polymethylmethacrylate (PS-b-PMMA) is used.

The self-assembling block copolymers are first dissolved in a suitable solvent system to form a block copolymer solution, which is then applied into each of the opening 19 provided by the guiding pattern masks 18P. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The copolymer material is not a conventional photoresist that may be developed upon exposure to ultraviolet light or optical light. Also, the copolymer layer is not a conventional low-k dielectric material.

After forming the copolymer layer within each opening 19 and on the exposed topmost surface of the lithographic material stack (12, 14 and 16), a self-assembled block copolymer structure 20L, 20R (i.e., nanoscale self-assembled self-aligned structure) is formed within each of the openings 19 by causing phase separation of the self-assembling block copolymers through annealing. Each self-assembled block copolymer structure 20L, 20R is self-aligned to the vertical sidewalls of each guiding pattern mask 18P and thus may be herein referred to as a "self-aligned assembly." In one embodiment, the copolymer layer can be annealed by solvent vapor annealing or by thermal annealing at an elevated temperature to form the first phase separate polymeric domains 22L, 22R including the first polymeric block component, and the second phase separate polymeric domains 24L, 24R including the second polymeric block component. The anneal may be performed, for example, at a temperature from about 200° C. to about 300° C. for a duration from 30 seconds to about 10 hours. Other anneal conditions (i.e., temperatures and times) may also be used in the present application to convert the copolymer layer into the self-assembled block copolymer structure 20L, 20R shown in FIG. 3 of the present application.

Each of the first phase separated polymeric domains 22L, 22R has a first width. Each of the second phase separated polymeric domains 24L, 24R has a second width. In some embodiments, the second width is the same as the first width. In other embodiments, the second width is different from the first width. Each of the first width and second widths are sub-lithographic, i.e., less than 40 nm.

As is shown, each first phase separated polymeric domain 22L, 22R and each second phase separated polymeric domain 24L, 24R of each self-assembled block copolymer structure 20L, 20R repeat in a regular pattern. Thus, and in accordance with the present application, each second phase separated polymeric domain 24L, 24R within a particular self-assembled block copolymer structure can be used to define a shape of an individual semiconductor fin, while each first phase separate polymeric domain 22L, 22R within the same self-assembled block copolymer structure can be used to define a spacing between each semiconductor fin that is defined by utilizing the method of the present application.

Figure 4:
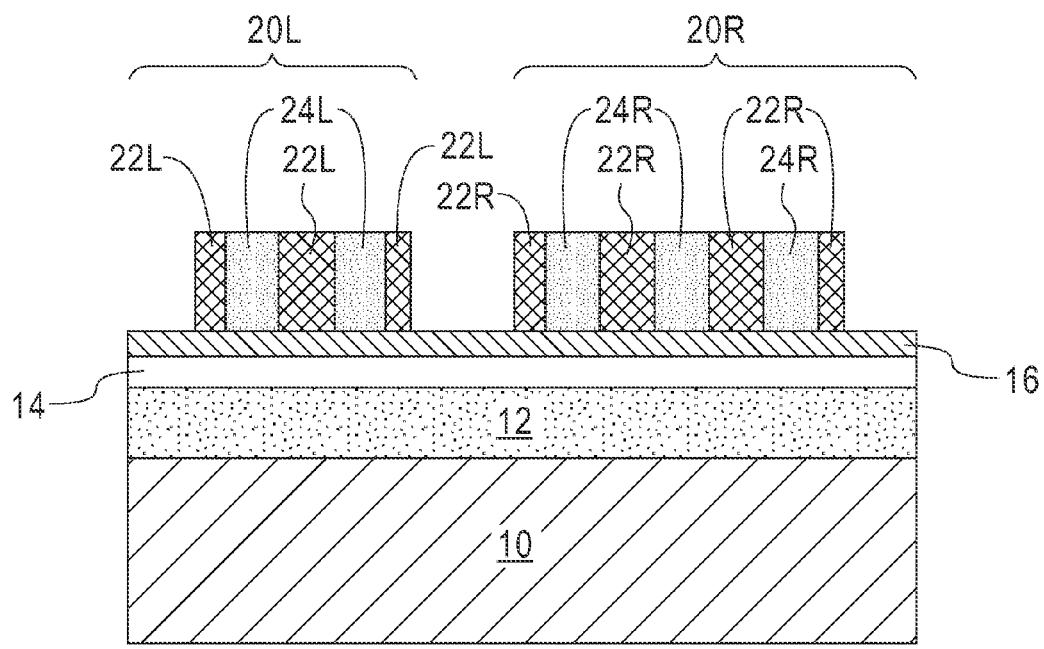
FIG. 4 is a cross sectional view of the exemplary semiconductor structure of FIG. 3 after removing each guiding pattern masks from the structure.

Referring now to FIG. 4, there is illustrated the exemplary semiconductor structure of FIG. 3 after removing each guiding pattern mask 18P from the structure. Each guiding pattern mask 18P can be removed utilizing an etching process that is selective in removing the material that provides each guiding pattern mask 18P and without damaging the self-assembled copolymer structure 20L, 20R. In one embodiment of the present application and when a hardened photoresist is employed as each guiding pattern mask 18P, each guiding pattern mask 18P can be removed utilizing an aqueous resist developer such as, for example, aqueous tetramethylammonium hydroxide (TMAH). In another embodiment of the present application, and when an inorganic e-beam resist such as HSQ is employed as each guiding pattern mask 18P, each guiding pattern mask 18P can be removed utilizing HF. Each self-assembled block copolymer structure 20L, 20R remains after removing each guiding pattern mask 18P.

Figure 5:
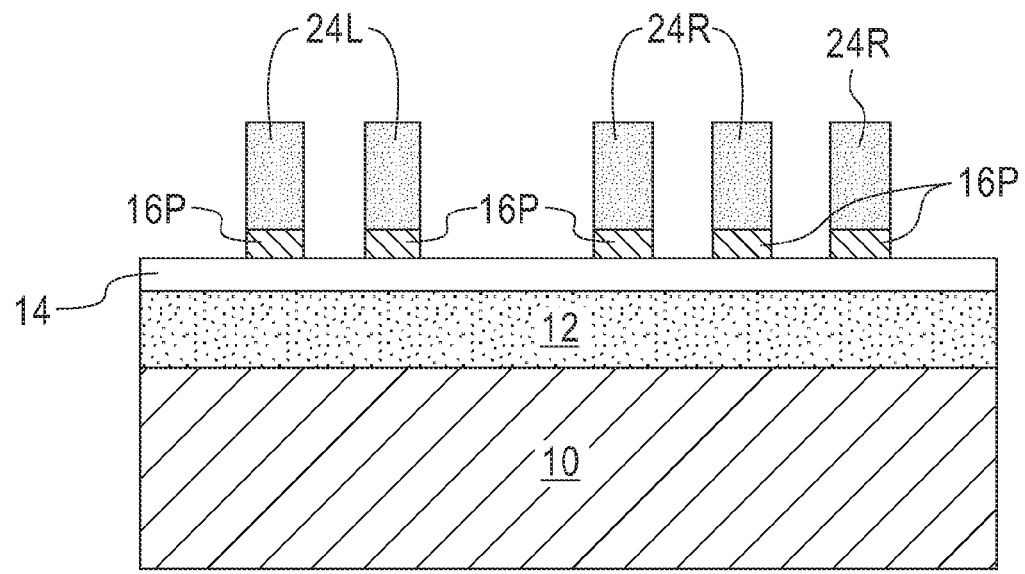
FIG. 5 is a cross sectional views of the exemplary semiconductor structure of FIG. 4 after selectively removing each first phase separated polymeric domain of the self-assembled block copolymer structure relative to each second phase separated polymeric domain of the self-assembled block copolymer structure and removing portions of the underlying orientation control layer not located directly underneath each remaining second phase separated polymeric domain.

Referring now to FIG. 5, there is illustrated the exemplary semiconductor structure of FIG. 4 after selectively removing each first phase separated polymeric domain 22L, 22R of the self-assembled block copolymer structure 20L, 20R relative to each second phase separated polymeric domain 24L, 24R of the self-assembled block copolymer structure 20L, 20R and removing portions of the underlying orientation control layer 16 not located directly underneath each remaining second phase separated polymeric domain 24L, 24R; each second phase separated polymeric domain acts as a mask during this step of the present application. Each remaining portion of the orientation control layer 16 is referred to herein as orientation control material portion 16P.

Each first phase separated polymeric domain 22L, 22R and the underlying orientation control layer 16 can be removed utilizing an etching process that selectively removes the materials of each first phase separated polymeric domain 22L, 22R and the underlying orientation control layer 16. In one embodiment, an oxygen-based etching process can be used to selectively remove each first phase separated polymeric domain 22L, 22R and the underlying orientation control layer 16.

After removing each first phase separated polymeric domain 22L, 22R and the orientation control layer 16, each second phase separated polymeric domain 24L, 24R and remaining portions of the orientation control layer (i.e., orientation control material portions 16P) that are not removed by this step of the present collectively provide an etch mask that can be used in defining each semiconductor fin within an upper semiconductor material portion of the semiconductor substrate 10. As is shown, each orientation control material portion 16P has sidewalls that are vertically aligned with sidewalls of a corresponding and overlying second phase separated polymeric domain 24L, 24R.

Figure 6:
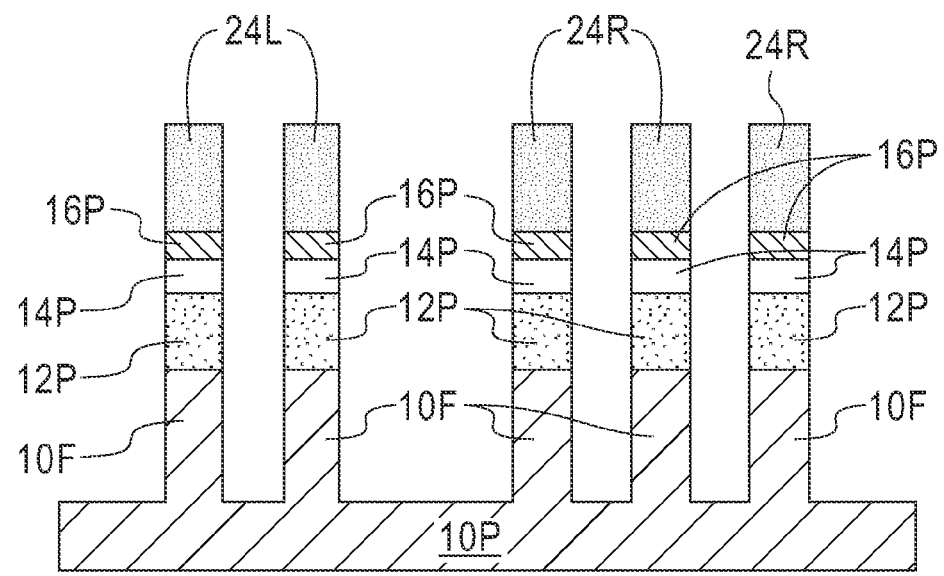
FIG. 6 is a cross sectional view of the exemplary semiconductor structure of FIG. 5 after continuing the pattern transfer into the remaining materials of the lithographic material stack and then into an upper semiconductor material portion of the semiconductor substrate.

Referring now to FIG. 6, there is illustrated the exemplary semiconductor structure of FIG. 5 after continuing the pattern transfer into the remaining materials of the lithographic material stack (12 and 14) and then into an upper semiconductor material portion of the semiconductor substrate 10. As shown, a plurality of semiconductor fins 10F are formed into an upper semiconductor material portion of the semiconductor substrate 10. The portion of the semiconductor substrate 10 that is located beneath each semiconductor fin 10F can be referred to herein as a substrate 10P. In some embodiments and when the semiconductor substrate 10 is a bulk semiconductor substrate, substrate 10P comprises a remaining semiconductor material portion of the bulk semiconductor substrate. In such an embodiment (and as shown), no material interface is present between each semiconductor fin 10F and substrate 10P. In another embodiment of the present application, and when the semiconductor substrate 10 is an SOI substrate, substrate 10P represents an insulator layer of the SOI substrate. In such an embodiment (not shown), a material interface would be present between the semiconductor fins 10F and the substrate 10P.

The term "fin" refers to a contiguous structure including a semiconductor material, such as silicon, and including a pair of vertical or slightly tapered sidewalls that are parallel to each other. As used herein, a surface is "vertical" if there exists a vertical plane from which the surface does not deviate by more than three times the root mean square roughness of the surface. In one embodiment of the present application, the semiconductor fin can have a height from 10 nm to 100 nm, and a width from 4 nm to 30 nm. In another embodiment of the present application, the semiconductor fin can have a height from 15 nm to 50 nm, and a width from 5 nm to 12 nm. In some embodiments, a single semiconductor fin is formed. In yet other embodiments, a plurality of semiconductor fins. The semiconductor fin or plurality of semiconductor fins may stand upon a remaining portion of a bulk semiconductor substrate or an insulator layer of an SOI substrate. The number of semiconductor fins 10F within a particular region can be customized by the size of opening 19 which, in turn, determines the number of second phase separated polymeric domains used as fin forming mask.

The structure shown in FIG. 6 can be formed by etching entirely through portions of the antireflective coating 14 and portions of the optical planarization layer 12 and partially through the semiconductor substrate 10 utilizing the second phase separated polymeric domains 24L, 24R and remaining portions of the orientation control layer 16 (i.e., orientation control material portions 16P) as an etch mask. The etch used in this embodiment includes one or more anisotropic etching processes. In one embodiment, a reactive ion etch is used to etch entirely through portions of the antireflective coating 14 and the optical planarization layer 12 and partially through the semiconductor substrate 10.

The portions of the antireflective coating layer 14 that remain after this pattern transfer etch are referred to here as antireflective coating material portions 14P. The portions of the optical planarization layer 12 that remain after this pattern transfer etch are referred to here as optical planarization portions 12P. In some embodiments, the sidewalls of each second phase separated polymeric domain 24R, 24R, each orientation control material portion 16P, each antireflective coating material portion 14P and each optical planarization portion 12P within a given vertical stack can be, but are not necessarily always, vertical aligned to each other. Also, each semiconductor fin 10F has sidewalls that are vertically aligned to each overlying material stack 12P, 14P, 16P, and 24L, 24R.

Figure 7:
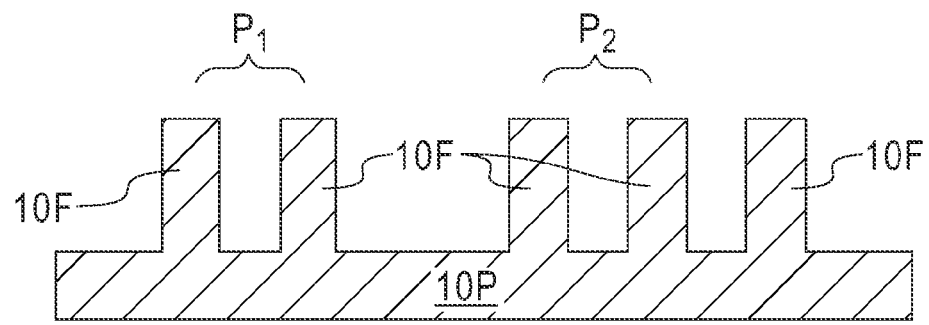
FIG. 7 is a cross sectional view of the exemplary semiconductor structure of FIG. 6 after exposing each resultant semiconductor fin that is formed in the upper semiconductor material portion of the semiconductor substrate.

Referring now to FIG. 7, there is illustrated the exemplary semiconductor structure of FIG. 6 after exposing each resultant semiconductor fin 10F that is formed in the upper semiconductor material portion of the semiconductor substrate 10. The exposing of each resultant semiconductor fin 10F comprises utilizing one or more etching steps that selectively removes each second phase separated polymeric domain 24L, 24R, each orientation control material portion 16P, each antireflective coating material portion 14P and each optical planarization portion 12P. In some embodiments, a planarization process can be used. In other embodiments, a combination of an etching process and a planarization process can be used to provide the structure shown in FIG. 7.

As is shown, each semiconductor fin 10F that is present in the array of semiconductor fins that was created by the self-assembled block copolymer structure 20L is separated by a first pitch ($P_1$), while each semiconductor fin 10F that is present in the array of semiconductor fins that was created by the self-assembled block copolymer structure 20R is separated by a second pitch ($P_2$); in the present application the pitch is determined from a central portion of one semiconductor fin to a central portion of a nearest neighboring semiconductor fin. In accordance with the present application $P_1$ and $P_2$ are equal to each other and are less than 30 nm.

Figure 8:
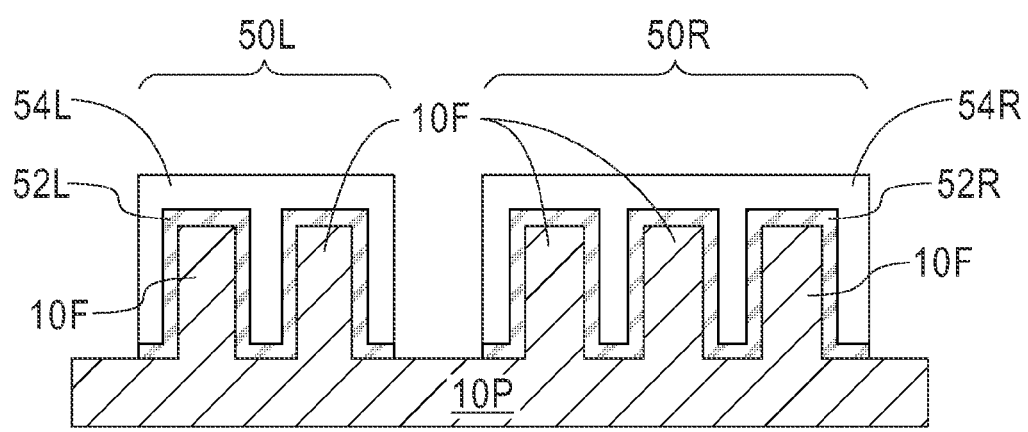
FIG. 8 is a cross sectional view of the exemplary semiconductor structure of FIG. 7 after forming a functional gate structure straddling each semiconductor fin.

Referring now to FIG. 8, there is illustrated the exemplary semiconductor structure of FIG. 7 after forming a first functional gate structure 50L straddling a first set of semiconductor fins 10F, and a second functional gate structure 50R straddling a second set of semiconductor fins 10F. Although only one first functional gate structure 50L and only one second functional gate structure 50R are described and illustrated, a plurality of first and/or second functional gate structures can be formed as desired.

By "functional gate structure" it is meant a permanent gate structure used to control output current (i.e., flow of carriers in the channel) of a semiconducting device through electrical or magnetic fields. Each functional gate structure 50L, 50R that is formed includes a gate material stack of, from bottom to top, a gate dielectric portion 52L, 52R, and a gate conductor portion 54L, 54R. In some embodiments (not shown), a gate cap portion can be present atop each gate conductor portion 54L, 54 R. In yet another embodiment (not shown), a localized isolation structure can be formed on the exposed portion of substrate 10P and between each semiconductor fin 10F.

Each gate dielectric portion 52L, 52R comprises a dielectric material. The gate dielectric material that provides each gate dielectric portion 52L, 52R can be an oxide, nitride, and/or oxynitride. In one example, the gate dielectric material that provides each gate dielectric portion 52L, 52R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion 52L, 52R.

The gate dielectric material used in providing each gate dielectric portion 52L, 52R can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 52L, 52R. In some embodiments, each gate dielectric portion 52L, 52R comprises a same gate dielectric material. In other embodiments, gate dielectric portion 52L comprises a different gate dielectric material from gate dielectric portion 52R. When a different gate dielectric material is used for the gate dielectric portions, block mask technology can be used. In one embodiment of the present application, the gate dielectric material used in providing each gate dielectric portion 52L, 52R can have a thickness in a range from 1 nm to 10 nm. Other thicknesses that are lesser than, or greater than, the aforementioned thickness range can also be employed for the gate dielectric material.

Each gate conductor portion 54L, 54R comprises a gate conductor material. The gate conductor material used in providing each gate conductor portion 54L, 54R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 54L, 54R may comprise an nFET gate metal. In other embodiments, each gate conductor portion 54L, 54R may comprise a pFET gate metal. In yet other embodiments, gate conductor portion 54L comprises an nFET gate metal, while gate conductor portion 54R comprises a pFET gate metal. In yet a further embodiment, gate conductor portion 54L comprises a pFET gate metal, while gate conductor portion 54R comprises an nFET gate metal.

The gate conductor material used in providing each gate conductor portion 54L, 54R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing each gate conductor portion 54L, 54R has a thickness from 1 nm to 100 nm. Other thicknesses that are lesser than, or greater than, the aforementioned thickness range can also be employed for the gate conductor material used in providing each gate conductor portion 54L, 54R.

Each gate cap portion comprises a gate cap material. The gate cap material that provides each gate cap portion may include a hard mask material such as, for example, silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure 50L, 50R can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching. Source/drain regions as described herein below can then be formed.

In other embodiments of the present application (not shown), sacrificial gate structures are first formed. By "sacrificial gate structure" it is meant a material or material stack that serves as a placeholder for a subsequently formed functional gate structure. In such an embodiment, the gate dielectric portion of the functional gate structures may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portions of the functional gate structures. The sacrificial gate material portion includes one of the gate conductor materials mentioned above for gate conductor portions of the functional gate structures. The sacrificial gate cap portion includes one of the gate cap material mentioned above for gate cap portions of the functional gate structures. The sacrificial gate structures can be formed by deposition of the various material layers and then patterning the resultant sacrificial material stack by utilizing, for example, lithography and etching. The sacrificial gate structures are replaced after forming source/drain regions.

Source/drain regions (not shown) are formed in exposed portions of the semiconductor fin 10F that are not covered by either the functional gate structure 50L, 50R or the sacrificial gate structures; in the drawing the source/drain regions would be located in front of the plane of the drawing and behind the plane of the drawing. The source/drain regions can be formed utilizing conventional techniques such as, for example, epitaxial growth, that are well known to those skilled in the art. As is known, the source region would be located on one side of each functional gate structure and the drain region would be located on the other side of each functional gate structures. In some embodiments, the source/drain regions can be unmerged. In yet other embodiments, the source/drain regions can be merged. The source/drain regions comprise a semiconductor material and an n-type or p-type dopant. In some embodiments, the source/drain regions may comprise a same semiconductor material as that of the semiconductor fin 10F. In some embodiments, the source/drain regions may comprise a different semiconductor material as that of the semiconductor fin 10F.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming semiconductor fins, said method comprising:
    forming a plurality of guiding pattern masks directly on a first portion of a topmost surface of an orientation control layer of a lithographic material stack, said lithographic material stack is located on a surface of a semiconductor substrate and said orientation control layer comprises a random copolymer;
    forming a self-assembled block copolymer structure between each neighboring pair of guiding pattern masks and directly on a second portion of said topmost surface of said orientation control layer of said lithographic material stack, said self-assembled block copolymer structure comprising a block copolymer having an array of first phase separated polymeric domains and an array of second phase separated polymeric domains, wherein each first phase separated domain and each second phase separated domain repeat in a regular manner filling an entire area between each neighboring pair of guiding pattern masks;
    selectively removing each guiding pattern mask without damaging said self-assembled block copolymer structure;
    selectively removing each first phase separated polymeric domain of said array of first phase separated polymeric domains relative to said array of second phase separated polymeric domains; and
    forming an array of semiconductor fins in an upper semiconductor material portion of said semiconductor substrate utilizing said array of second phase separated polymeric domains as an etch mask.

2. The method of claim 1, wherein said lithographic material stack further comprises an optical planarization layer and an antireflective coating, wherein said antireflective coating layer is located between said optical planarization layer and said orientation control layer.

3. The method of claim 1, wherein each guiding pattern mask of said plurality of guiding pattern masks comprises a hardened photoresist.

4. The method of claim 3, wherein said hardened photoresist is formed by:
    forming a blanket layer of photoresist material on a topmost surface of said lithographic material stack;
    patterning said blanket layer of photoresist material by lithography to provide a plurality of patterned photoresist portions;
    applying a hardening agent to each patterned photoresist portion;
    subjecting each patterned photoresist portion including said hardening agent to a baking process followed by a solvent rinse step.

5. The method of claim 3, wherein said removing each guiding pattern mask comprises contacting said hardened photoresist with an aqueous developer.

6. The method of claim 1, wherein each guiding pattern mask of said plurality of guiding pattern masks comprise an e-beam resist.

7. The method of claim 6, wherein said e-beam resist comprises hydrogen silsesquioxane (HSQ) or methyl silsesquioxane (MSQ).

8. The method of claim 6, wherein said removing each guiding pattern mask comprises contacting said e-beam resist with HF.

9. The method of claim 1, wherein said forming said self-assembled block copolymer structure comprises:
    spin-coating a copolymer layer that contains self-assembling block copolymers; and
    annealing said copolymer layer.

10. The method of claim 1, wherein each first phase separated polymeric domain of said array of first phase separated polymeric domains comprises poly(methyl methacrylate) and wherein each second phase separated polymeric domain of said array of second phase separated polymeric domains comprises polystyrene.

11. The method of claim 2, wherein said antireflective coating comprises a silicon containing antireflective coating material.

12. The method of claim 11, wherein said optical planarization layer comprises amorphous carbon, spin-on carbon, an organic material including at least C, O, and H, or diamond-like carbon.

13. The method of claim 1, wherein said random copolymer that provides said orientation control layer contains a polar polymeric component and a non-polar polymeric component.

14. The method of claim 1, wherein said selectively removing each first phase separated polymeric domain of said array of first phase separated polymeric domains relative to said array of second phase separated polymeric domains comprises an oxygen-based etching process, and wherein portions of said orientation control layer not located beneath each second phase separated polymeric domain are also selectively removed.

15. The method of claim 14, wherein said forming said array of semiconductor fins comprises:

etching entirely through portions of said antireflective coating and said optical planarization layer and partially through said semiconductor substrate utilizing said array of second phase separated polymeric domains and remaining portions of said orientation control layer as an etch mask.

16. The method of claim 15, wherein said etching entirely through portions of said antireflective coating and said optical planarization layer and partially through said semiconductor substrate comprises reactive ion etching.

17. The method of claim 15, further comprises removing remaining portions of said lithographic material stack from atop each semiconductor fin.

18. The method of claim 1, wherein said semiconductor substrate is a bulk semiconductor substrate.

19. The method of claim 1, wherein said semiconductor substrate is a semiconductor-on-insulator, and said upper semiconductor material portion of said semiconductor substrate is a top semiconductor layer of said semiconductor-on-insulator substrate.

20. The method of claim 1, wherein each semiconductor fin is separated from a nearest neighboring semiconductor fin by a pitch that is less than 30 nm.

* * * * *